(12) United States Patent
Chiang et al.

(10) Patent No.: US 6,963,135 B2
(45) Date of Patent: Nov. 8, 2005

(54) SEMICONDUCTOR PACKAGE FOR MEMORY CHIPS

(75) Inventors: Cheng-Chian Chiang, Taichung (TW); Chih-Ming Huang, Taichung (TW); Chin-Huang Chang, Taichung (TW); Cheng-Hsu Hsiao, Taichung (TW); Min-Nan Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 10/816,339

(22) Filed: Mar. 31, 2004

(65) Prior Publication Data

US 2005/0093143 A1     May 5, 2005

(30) Foreign Application Priority Data

Nov. 3, 2003 (TW) ............................. 92130610 A

(51) Int. Cl.⁷ .............................................. H01L 23/34
(52) U.S. Cl. ..................... 257/723; 257/685; 257/686
(58) Field of Search ............................... 257/723, 678, 257/685–687

(56) References Cited

U.S. PATENT DOCUMENTS

| | | | |
|---|---|---|---|
| 4,264,917 A | * | 4/1981 | Ugon .......................... 257/668 |
| 5,677,524 A | | 10/1997 | Haghiri-Tehrani |
| 5,866,953 A | * | 2/1999 | Akram et al. ................ 257/790 |
| 6,040,622 A | | 3/2000 | Wallace |
| 6,570,249 B1 | * | 5/2003 | Liao et al. .................... 257/724 |

FOREIGN PATENT DOCUMENTS

JP        62-239554        10/1987

* cited by examiner

Primary Examiner—Phat X. Cao
Assistant Examiner—Theresa T. Doan
(74) Attorney, Agent, or Firm—Mikio Ishimaru

(57) ABSTRACT

A semiconductor package includes two substrates each having a plurality of electrical connection pads, at least one chip mounted on each of the substrates, an encapsulation body formed on each of the substrates for encapsulating the chip, and an cover for receiving the substrates and the chips therein. The chip is electrically connected to the electrical connection pads. The electrical connection pads are exposed from the cover and located on the same surface or oppositely arranged. The substrates and the cover each substantially has a rectangular shape, with a longer side of each of the substrates being vertical to a longer side of the cover. The semiconductor package is incorporated with multiple chips to enhance the performance and memory capacity thereof, and the substrates are smaller than those in the prior art and thus are more cost-effective to fabricate.

7 Claims, 6 Drawing Sheets

SEMICONDUCTOR PACKAGE FOR MEMORY CHIPS

FIELD OF THE INVENTION

The present invention relates to semiconductor packages, and more particularly, to a card type of semiconductor package such as multimedia card (MMC) for packaging memory chips such as electrically erasable programmable read-only memory (EEPROM) chips.

BACKGROUND OF THE INVENTION

Multimedia card (MMC) is a high capacity flash memory circuit module, which can be coupled to an electronic information platform such as personal computer (PC), personal digital assistant (PDA), digital camera or multi-media browser, to store various digital multi-media data e.g. digital photo data, video data or sound data. The specification of current MMC complies with the MMCA (multimedia card association) standards.

MMC package is a small scale integrated circuit (IC) device having a memory chip and/or a controller chip to store and process the multi-media data such as digital pictures and image data. The memory chip and/or controller chip are/is mounted on a chip carrier such as substrate or lead frame that mediate the electrical connection between the chip(s) and an external device to the chip(s) to operate. Conventional MMC packages have been disclosed in U.S. Pat. No. 5,677,524 entitled "Chip Card and a Method for Producing it", U.S. Pat. No. 6,040,622 entitled "Semiconductor Package Using Terminals Formed on a Conductive Layer of a Circuit Board", and Japanese Patent No. 62-239554 entitled "IC Card Type EP-ROM Structure", which are incorporated herein by reference.

FIGS. 1A to 1C show the fabrication processes for a conventional MMC. Referring to FIG. 1A, the first step is to prepare an array of integrally formed substrates 10. Each of the substrates 10 includes at least one chip attach area 11, a plurality of passive component attach areas 12, and a plurality of electrical connection pads 13. The electrical connection pads 13 each extends from a top surface to a bottom surface of the substrate 10 to serve as contacts for external electrical connection for the MMC. The MMC to be fabricated is predetermined to have standard dimensions of 32 mm (length)×24 mm (width)×1.4 mm (height), and thus each substrate 10 is sized 30.25 mm (length)×21.25 mm (width).

Referring to FIG. 1B, a plurality of passive components 30 such as resistors, capacitors and/or inductors are mounted on the passive component attach areas 12 on each of the substrates. Then, at least one chip 20 is mounted on the chip attach area 11 of each of the substrates 10, and a wire-bonding process is performed to form a set of bonding wires 40 such as gold wires for electrically connecting the chip 20 to the electrical connection pads 13 on each of the substrates 10. Subsequently, an encapsulation process is carried out to form an encapsulation body 50 on each of the substrates 10 to encapsulate the corresponding chip 20 and bonding wires 40. And a singulation process is performed to separate apart the integrally formed substrates 10.

Referring to FIG. 1C, a cover 60 is attached to the encapsulation body 50 on each of the substrates 10 via an adhesive layer 51, wherein the cover 60 forms a receiving space 61 to receive the corresponding substrate 10 and encapsulation body 50 therein. This thereby completes the fabrication for the MMC. FIG. 1D shows a bottom view of the fabricated MMC, having the electrical connection pads 13 exposed to serve as contacts for external electrical connection.

Since the predetermined dimensions of the MMC is 32 mm (length)×24 mm (width), the cover 60 should have the same dimensions of 32 mm (length)×24 mm (width), and the receiving space 61 is sized 30.25 mm (length)×21.25 mm (width) corresponding to the substrate 10.

However, the above fabrication method has a significant drawback that the size of substrate 10 is relatively much larger than that of the chip 20, making the fabrication cost undesirably increased. Moreover, the cover 60 is correspondingly sized to form a sufficient receiving space 61 for receiving the substrate 10, thereby difficult to further reduce the profile of the MMC. Since the chip 20 is relatively much smaller than the substrate 10, some part of the receiving space 61 is waste, which is unfavorable for high integration development of packaging technology.

Therefore, the problem to be solved here is to provide a MMC package that can be cost-effectively fabricated with high integration.

SUMMARY OF THE INVENTION

In light of the above, an objective of the present invention is to provide a semiconductor package such as MMC whose the memory capacity and performance can be increased by changing the size of a substrate and the positions of components within a cover of the semiconductor package.

Another objective of the present invention is to provide a semiconductor package such as MMC in which more chips can be incorporated.

A further objective of the present invention is to provide a semiconductor package such as MMC for which the fabrication cost of the substrate can be reduced.

In accordance with the above and other objectives, the present invention proposes a semiconductor package comprising: two substrates each having a chip attach area and a plurality of electrical connection pads thereon; at least one chip mounted on the chip attach area of each of the substrates and electrically connected to the electrical connection pads; two encapsulation bodies respectively formed on the two substrates for encapsulating the chip on each of the substrates to form two package units; and a cover for receiving the two package units therein; wherein the substrates and the cover each substantially has a rectangular shape, with a longer side of each of the substrates being vertical to a longer side of the cover, and the electrical connection pads of the two substrates are exposed from the cover and located on the same surface.

In another embodiment of the present invention, the semiconductor package comprises: two substrates each having a chip attach area and a plurality of electrical connection pads thereon; at least one chip mounted on the chip attach area of each of the substrates and electrically connected to the electrical connection pads; two encapsulation bodies respectively formed on the two substrates for encapsulating the chip on each of the substrates to form two package units; and a cover for receiving the two package units therein; wherein the substrates and the cover each substantially has a rectangular shape, with a longer side of each of the substrates being vertical to a longer side of the cover, and the electrical connection pads of the two substrates are exposed from the cover and oppositely arranged.

The above semiconductor package may further comprise another chip stacked on the at least one chip mounted on the substrate.

As compared to the prior art, the MMC package according to the present invention uses smaller substrates sized 18 mm (length)×10 mm (width) instead of conventional larger substrates (21.25 mm×30.25 mm), and changes the positions of substrates therein with chips stacked on the substrate, so as to allow a predetermined-sized cover to accommodate more substrates and more chips mounted on the substrates, thereby enhancing the performance and memory capacity of the MMC package. Further, since the cost of a smaller substrate in the present invention is about NT$ 4.0 while the cost of the conventional larger substrate is about NT$ 20.0, such that the fabrication costs of the substrates and the MMC package can be effectively reduced in the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package such as MMC (multimedia card) proposed in the present invention are described in detail with reference to FIGS. 2A to 2E and 3A to 3B.

FIGS. 2A to 2D show the fabrication processes for the MMC package in accordance with a first embodiment of the present invention.

Figure 1A:
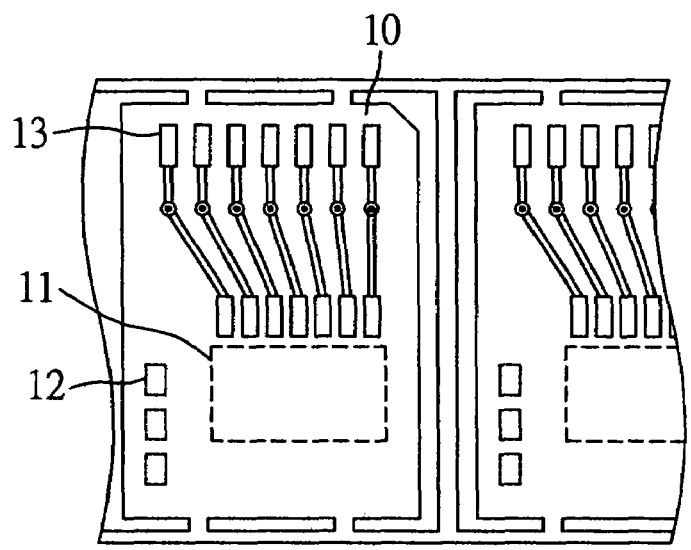
FIGS. 1A to 1C (PRIOR ART) are schematic diagrams showing fabrication processes for a conventional MMC.
Figure 1B:
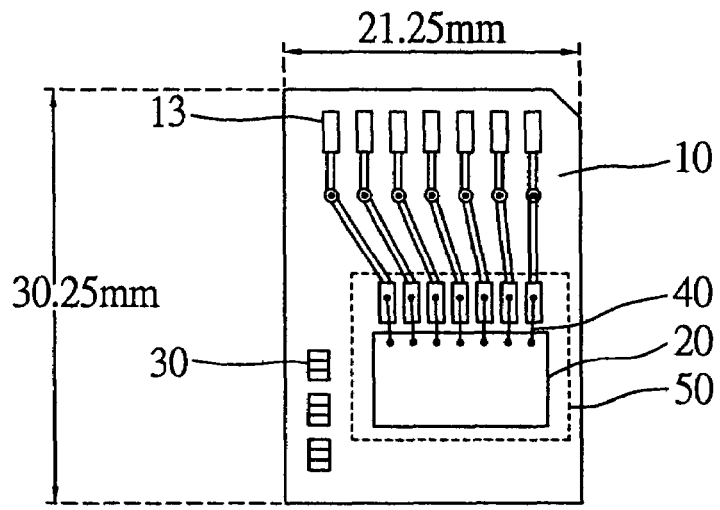
Figure 1C:
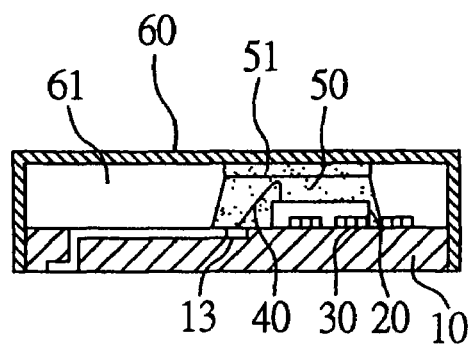
Figure 1D:
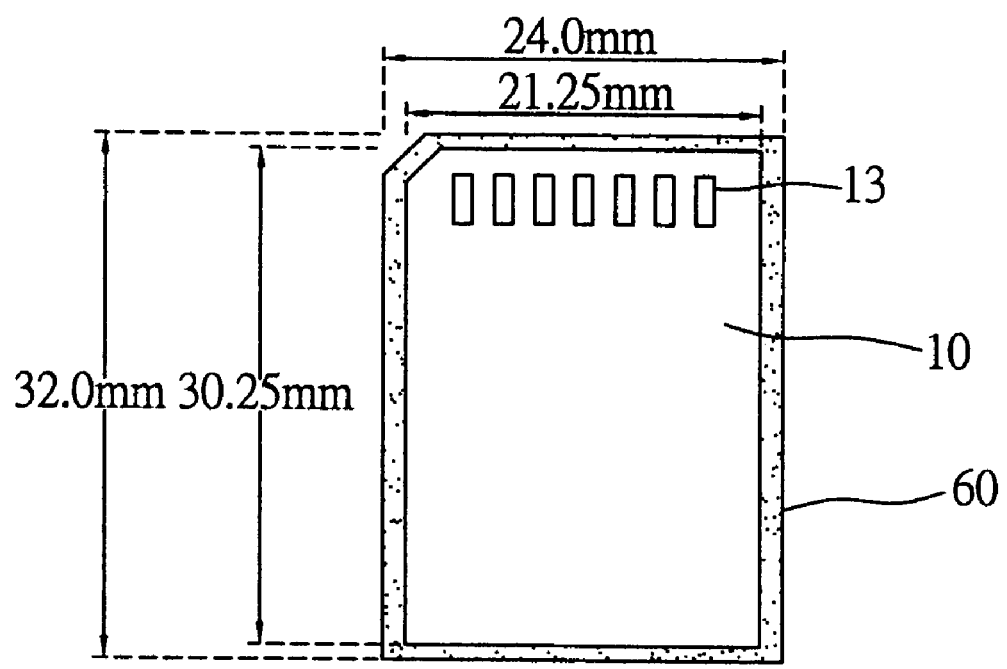
FIG. 1D (PRIOR ART) is a bottom view of the MMC of FIG. 1C.
Figure 2A:
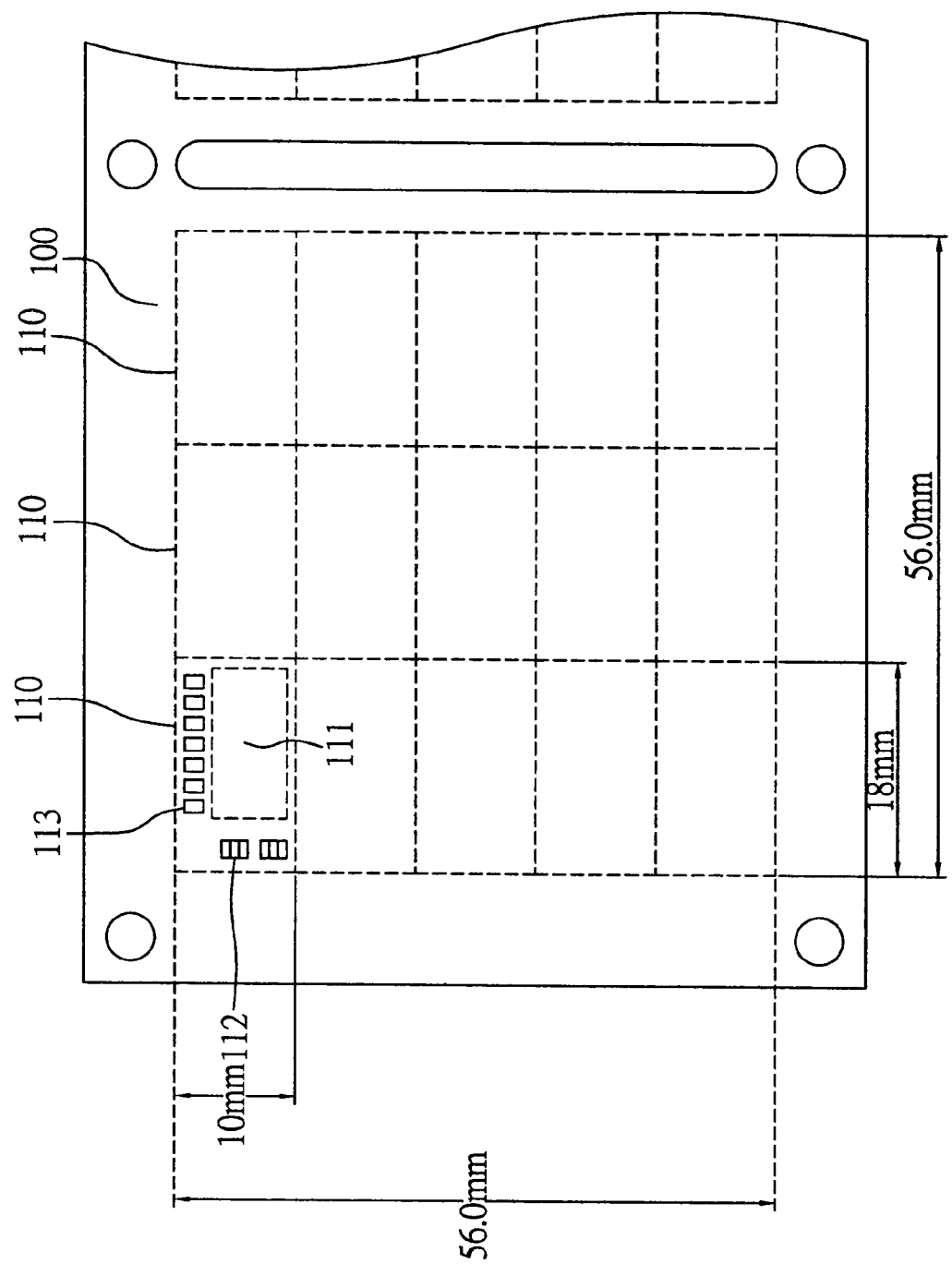
FIGS. 2A to 2D are schematic diagrams showing fabrication processes for a MMC in accordance with a first embodiment of the present invention.

Referring to FIG. 2A, the first step is to prepare a substrate strip 100 comprising an array of integrally formed substrates 110. Each of the substrates 110 includes at least one chip attach area 111, a plurality of passive component attach areas 112 (optional), and a plurality of electrical connection pads 113. The electrical connection pads 113 each extends from a top surface to a bottom surface of the substrate 110 to serve as contacts for external electrical connection for the MMC package.

The substrate strip 100 is substantially sized 56 mm (length)×56 mm (width), and is pre-defined into 15 substrates 110 (5×3), each of the substrates 110 substantially having dimensions of 18 mm (length)×10 mm (width).

Figure 2B:
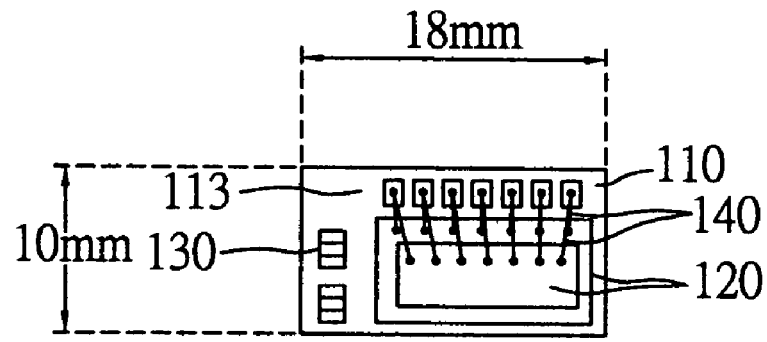

Referring to FIG. 2B, a die-bonding process is performed to mount two stacked chips 120 on the chip attach area 111 of each of the substrates 110 (only one substrate is shown). The chip 120 can be a memory chip such as electrically erasable programmable read-only memory (EEPROM) chip. Then, a wire-bonding process is carried out to form two sets of bonding wires 140 such as gold wires, wherein one set of bonding wires 140 electrically connect the upper chip 120 to the corresponding electrical connection pads 113 of the substrate 110, and the other set of bonding wires 140 electrically connect the lower chip 120 to the corresponding electrical connection pads 113 of the substrate 110. Alternatively, if passive components 130 are required, they can be mounted on the passive component attach areas 112 before the die-bonding process. If the chips 120 are integrated with required passive components, the mounting step of passive components is not necessary.

Figure 2C:
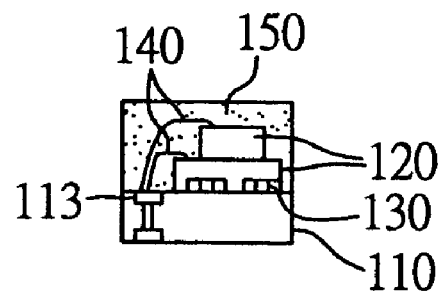

Referring to FIG. 2C, an encapsulation process is performed to form an encapsulation body 150 on the substrate strip 100 to encapsulate all the chips 120 and bonding wires 140 on the substrates 110. Then a singulation process is carried out to cut through the encapsulation body 150 and the substrate strip 100 to separate apart the integrally formed substrates 110, thereby forming a plurality of package units (only one is shown) each having a singulated substrate 110. Each of the package units has the same dimensions of 18 mm×10 mm as the substrate 110.

Figure 2D:
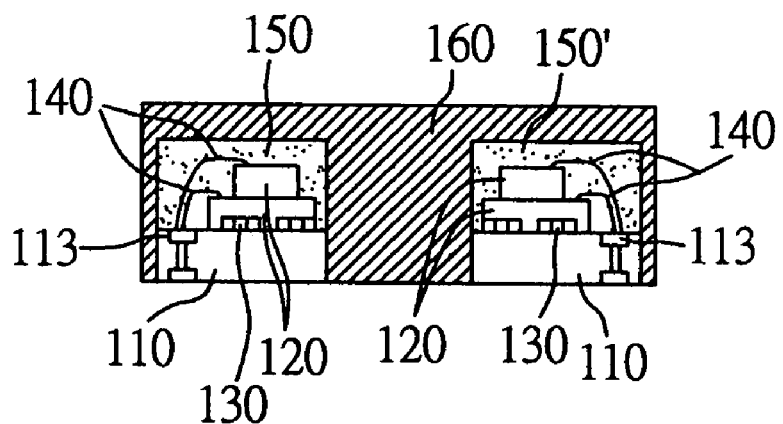

Referring to FIG. 2D, every two of the above package units are covered by and embedded in two receiving spaces of a rectangular cover 160 respectively. The cover 160 can be pre-prepared as a separate component, or can be fabricated by injection molding and attached to the two package units during the above fabrication processes. The cover 160 is substantially sized 32 mm (length)×24 mm (width). This completes the fabrication of the MMC package.

Figure 2E:
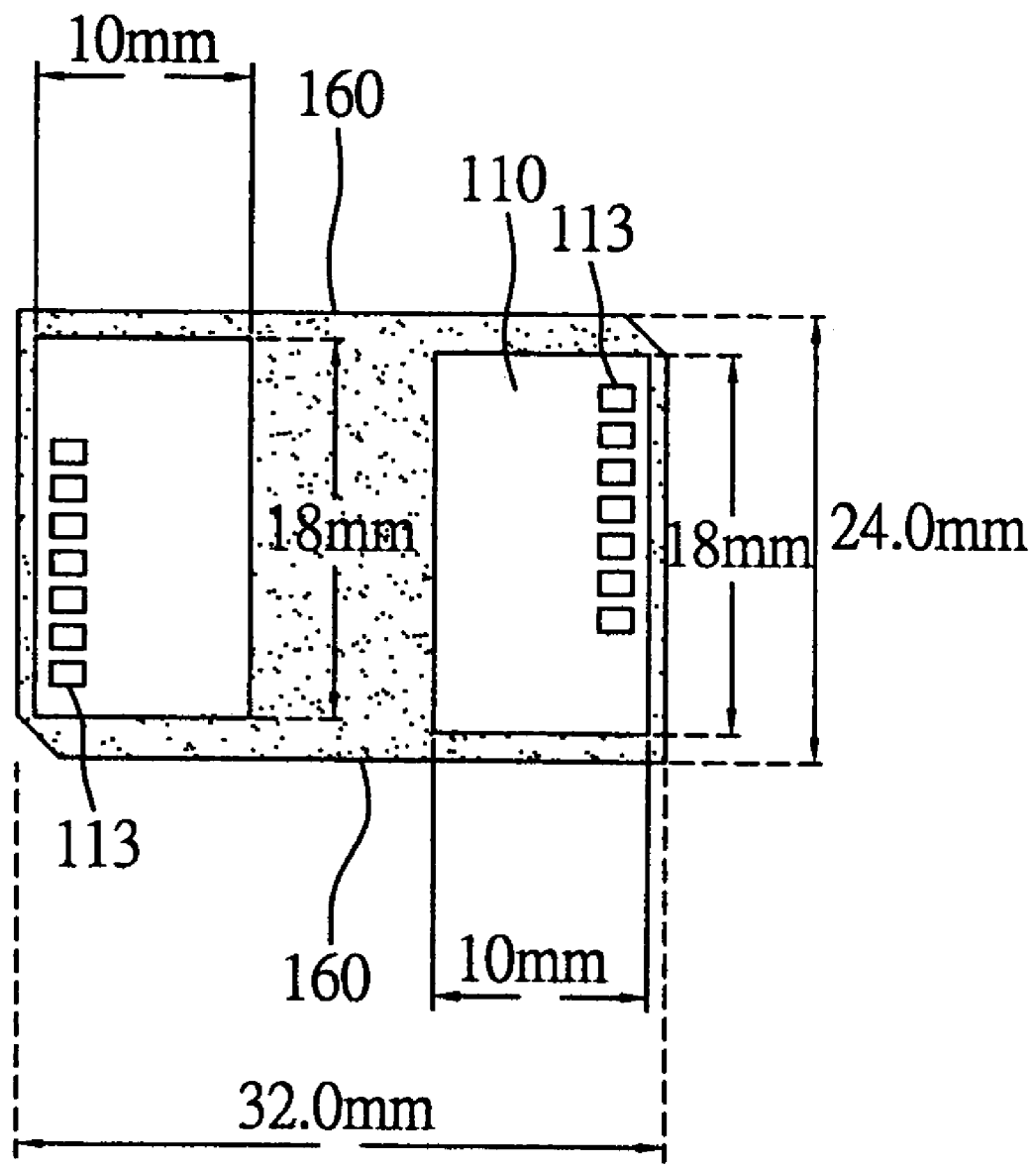
FIG. 2E is a bottom view of the MMC of FIG. 2D.

As shown in FIGS. 2D and 2E, the MMC package comprises two substrates 110, each having a chip attach area and a plurality of electrical connection pads 113; two stacked chips 120 mounted on the chip attach area of each of the substrates 110 and electrically connected to the electrical connection pads 113; an encapsulation body 150, 150' formed on each of the substrates 110 to encapsulate the chips 120; and a rectangular cover 160 having two receiving spaces for receiving the substrates 110, the chips 120 and the encapsulation bodies 150, 150' therein. The two receiving spaces of the cover 160 have openings on the same surface of the cover 160. The longer side of each of the substrates 110 is vertical to the longer side of the cover 160. The electrical connection pads 113 of the two substrates 110 are exposed from the cover 160 and arranged on the same surface and along opposite edges of the cover 160, such that the MMC package has two plug terminals for dual usage and also has doubled memory capacity.

Figure 3A:
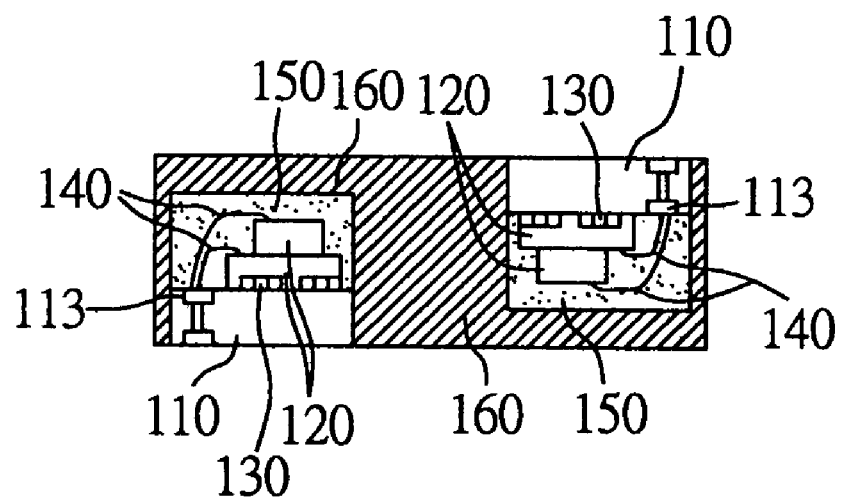
FIG. 3A is a cross-sectional view of a MMC in accordance with a second embodiment of the present invention.
Figure 3B:
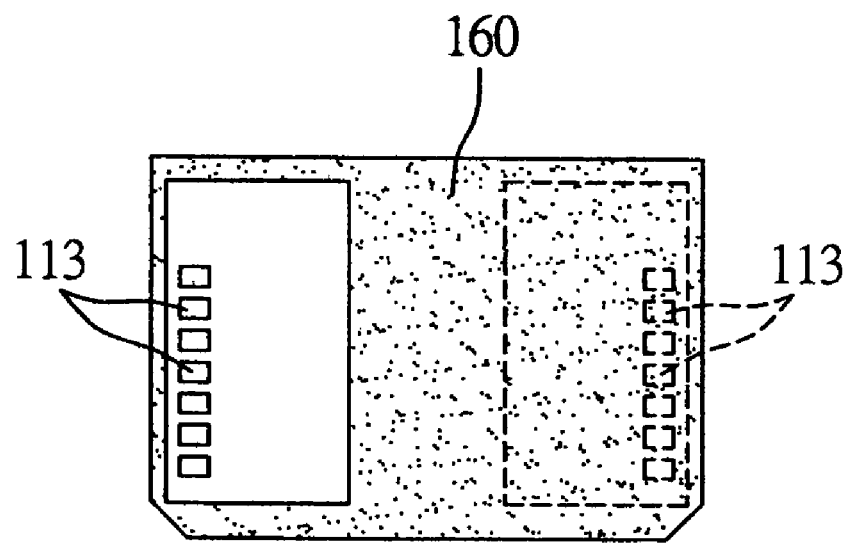
FIG. 3B is a bottom view of the MMC of FIG. 3A.

FIGS. 3A and 3B show a MMC package according to a second embodiment of the present invention. This MMC package is structurally similar to that of the first embodiment except for the cover 160 having two receiving spaces with openings that face oppositely and are located on opposite surfaces (top and bottom surfaces) of the cover 160.

The MMC package of the second embodiment comprises two substrates 110, each having a chip attach area and a plurality of electrical connection pads 113; at least two stacked chips 120 mounted on the chip attach area of each of substrates 110 and electrically connected to the electrical connection pads 113; an encapsulation body 150 formed on each of the substrates 110 for encapsulating the chips 120; and a rectangular cover 160 for receiving the two substrates 110, chips 120 and encapsulation bodies 150 therein. The longer side of each of the substrates 110 is vertical to the longer side of the cover 160. The electrical connection pads 113 on the two substrates 110 are exposed on the opposite surfaces (top and bottom surfaces) of the cover 160. This allows the fabricated MMC package to have two opposite plug terminals for dual usage and have doubled memory capacity.

As compared to the prior art, the MMC package according to the present invention uses smaller substrates sized 18 mm (length)×10 mm (width) instead of conventional larger substrates (21.25 mm×30.25 mm), and changes the positions of substrates therein with chips stacked on the substrate, so as to allow a predetermined-sized cover to accommodate more substrates and more chips mounted on the substrates, thereby enhancing the performance and memory capacity of the MMC package. Further, since the cost of a smaller substrate in the present invention is about NT$ 4.0 while the cost of the conventional larger substrate is about NT$ 20.0, such that the fabrication costs of the substrates and the MMC package can be effectively reduced in the present invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package comprising:
    two substrates each having a chip attach area and a plurality of electrical connection pads thereon;
    at least one chip mounted on the chip attach area of each of the substrates and electrically connected to the electrical connection pads;
    two encapsulation bodies respectively formed on the two substrates for encapsulating the chip on each of the substrates to form two package units; and
    a cover for receiving the two package units therein;
    wherein the substrates and the cover each substantially has a rectangular shape, with a longer side of each of the substrates being vertical to a longer side of the cover, and the electrical connection pads of the two substrates are exposed from the cover and located on the same surface.

2. The semiconductor package as recited in claim 1, wherein the cover is substantially sized 32 mm long and 24 mm wide.

3. The semiconductor package as recited in claim 1, wherein the substrate is substantially sized 18 mm long and 10 mm wide.

4. The semiconductor package as recited in claim 1, wherein the substrate further comprises a plurality of passive component attach areas thereon.

5. The semiconductor package as recited in claim 1, wherein the chip is electrically connected to the electrical connection pads via a plurality of bonding wires.

6. The semiconductor package as recited in claim 1, wherein the semiconductor package is a multimedia card (MMC) package.

7. The semiconductor package as recited in claim 1, further comprising another chip stacked on the at least one chip mounted on the substrate.

* * * * *